United States Patent
Takahashi et al.

[11] Patent Number: 5,902,957
[45] Date of Patent: May 11, 1999

[54] LINE RADIATION PREVENTING ELEMENT

[75] Inventors: Michiharu Takahashi, Yachiyo; Hitoshi Komine, Bunkyo-Ku, both of Japan

[73] Assignee: Uro Denshi Kogyo Kabushiki Kaisha, Tokyo, Japan

[21] Appl. No.: 08/861,217

[22] Filed: May 21, 1997

[30] Foreign Application Priority Data

May 28, 1996 [JP] Japan .................................. 8-133582

[51] Int. Cl.⁶ .................................................. H01B 7/34
[52] U.S. Cl. .......................................... 174/36; 333/243
[58] Field of Search .......................... 174/34, 36, 35 TS, 174/28; 333/12, 243, 206, 245, 160

[56] References Cited

U.S. PATENT DOCUMENTS

| | | | |
|---|---|---|---|
| 2,052,317 | 8/1936 | Schelkunoff | 333/243 |
| 3,167,729 | 1/1965 | Hall | 333/206 |
| 3,238,477 | 3/1966 | Brueckmann | 333/243 |
| 3,959,785 | 5/1976 | Nichols et al. | 365/139 |
| 4,004,257 | 1/1977 | Geissler | 333/206 X |
| 4,571,473 | 2/1986 | Wyslouzil et al. | 219/10.55 A |
| 4,737,970 | 4/1988 | Viola et al. | 375/106 |

*Primary Examiner*—Kristine Kincaid
*Assistant Examiner*—Chau N. Nguyen
*Attorney, Agent, or Firm*—Jacobson, Price, Holman & Stern, PLLC

[57] ABSTRACT

A line radiation preventing element absorbs undesired radio waves superposed upon a wire or a coaxial cable by use of a magnetic substance, instead of reflection of the undesired radio waves and without increasing the cost thereof. The line radiation preventing element for preventing undesired radio waves superposed upon a wire led out of an electronic appliance from being radiated, has a conductive core wire (2) connected to the wire (5) led out of the electronic appliance; a conductive outer pipe (1) arranged concentrically with the conductive core wire (2), one end of the conductive outer pipe being shorted to the conductive core wire by use of at least one of a shorting plate (3) or an electric capacitance (14) and the other end of the conductive outer pipe being opened; and a magnetic substance (7) arranged between the conductive core wire and an inner wall of the conductive outer pipe.

12 Claims, 14 Drawing Sheets

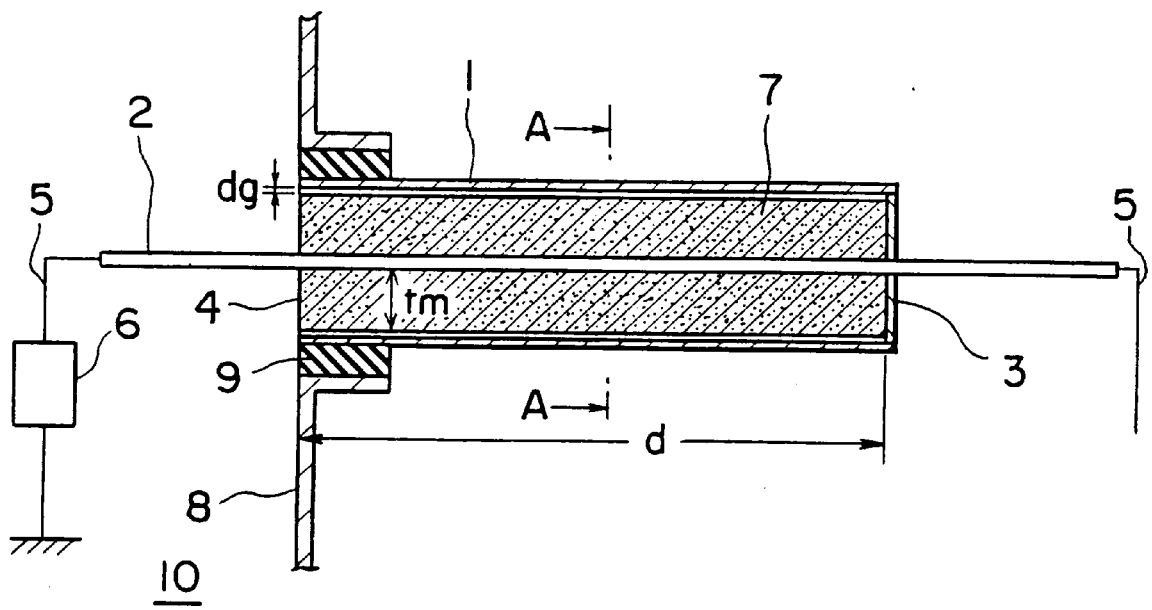
F I G. 3 (a)
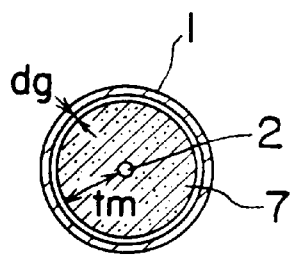
F I G. 3 (b)

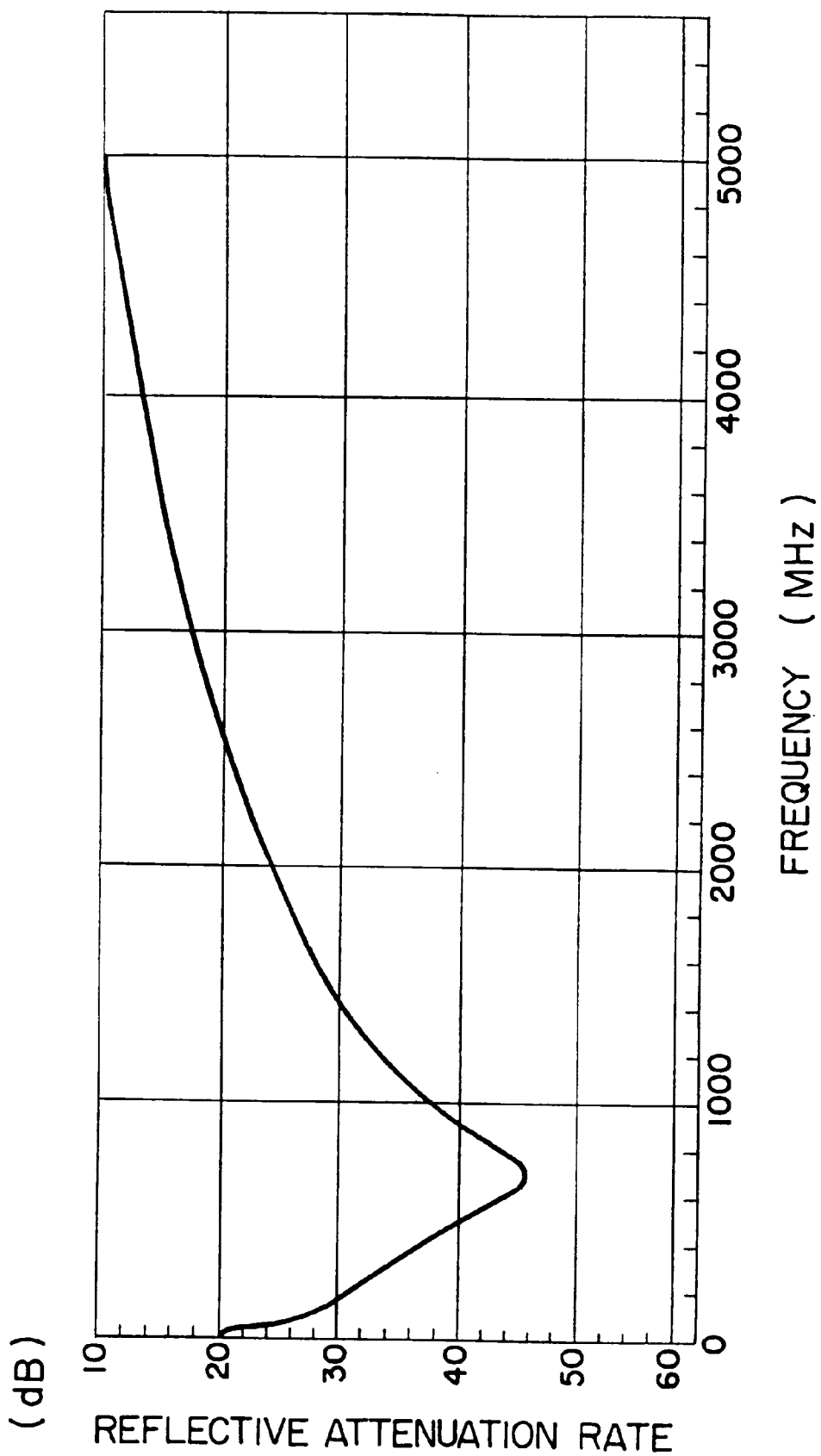
F I G. 4

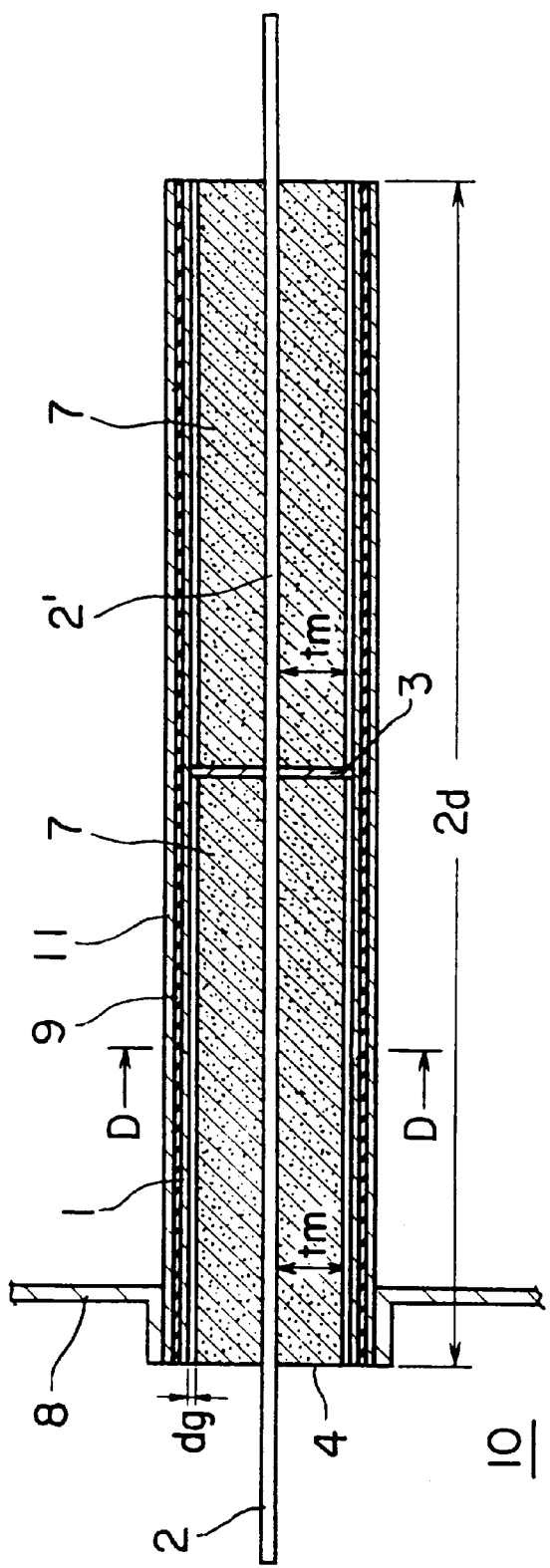
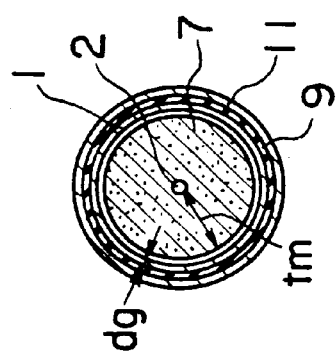
FIG. 8 (a)
FIG. 8 (b)

LINE RADIATION PREVENTING ELEMENT

BACKGROUND OF THE INVENTION

1. Field of the Invention

The present invention relates to a line radiation preventing element for preventing undesired radio waves from being radiated from lines or wires, and more specifically to a line radiation preventing element for preventing undesired radio waves from being radiated from lines and simultaneously from entering to an electronic appliance from the outside thereof through lines. Here, the lines are power lines, signal input/output lines, control lines, etc. led out of a casing or a chassis of the electronic appliance. Further, the undesired radio waves are induced through the lines inside and/or outside the electronic appliance.

2. Description of the Prior Art

When a cable or a coaxial cable including power lines, signal input/output lines, control lines, etc. is led out of a casing or a chassis of an electronic appliance, since electromagnetic waves (referred to as radio waves, hereinafter) generated inside the casing are superposed upon these lines, the radio waves are transmitted to the outside of the casing through the lines and then radiated to the circumference. In contrast with this, undesired radio waves enter the electronic appliance through the lines as jamming (interfering) radio waves or noise.

The undesired radio waves radiated by one electronic appliance interfere with signals of the other appliances, so that the other appliances may be operated erroneously or subjected to ghost interference, for instance. As a result, the electric stability and the signal quality of the other appliances deteriorate.

Conventionally, in order to remove the interfering radio waves such as undesired radio waves or noise induced by and superposed upon the lines (e.g., the power line, input/output lines, control lines, connecting lines between two circuits, etc.) from the electronic appliance, various elements such as filters, capacitors, choke coils, ferrite beads, etc. have been connected in series to the line upon which interfering radio waves are superposed or between the line and the ground.

In the above-mentioned prior art method, since the line impedance changes to a high impedance value or a low impedance value (shorted) at frequency of the noise superposed upon the line, the interfering radio waves can be reflected from the high impedance element or bypassed to the ground through the low impedance element, with the result that undesired radio waves are prevented from being radiated to the outside or entering into the inside of the electronic appliance.

FIG. 14 shows an example of the prior art reflective interfering wave removing method, in which a first electronic appliance having no choke coil and a second electronic appliance having a choke coil are both connected to a common power source. As shown in FIG. 14, direct interfering radio waves superposed upon a power source line and additionally indirect interfering radio waves reflected from the second electronic appliance both enter the first electronic appliance. Therefore, when the phases of both the direct and indirect interfering radio waves match each other, there exists the case where the first electronic appliance is subjected to a strong interference, as compared when the second electronic appliance is not connected to the common power source. In addition to the above-mentioned radio interference, since the inductance of the choke coil connected to the second electronic appliance is reduced due to the presence of capacitances formed between the choke coil wires, there exists such a problem in that the reflection capability of noise deteriorates markedly in a high frequency range.

In the case of the ferrite beads used for the same object as with the case of the choke coil, there exists no problem with respect to the capacitance between wires, and further noise can be consumed as heat by use of a high ferrite resistance at high frequency. However, since the resistance is several tens ohms at the most, the resistance and the reflection capability are both not sufficient according to the line path. Further, there exists a possibility that the harmful influence of the re-radiation of interfering radio waves as shown in FIG. 14 occurs even in the case of ferrite beads.

Instead of the above-mentioned method such that the load side of the electronic appliance is opened to reflect interfering radio waves, there exists such another method that the load side of the electronic appliance is shorted to reflect interfering radio waves by use of a capacitance connected between the line and the ground. In this method, however, as far as the common power source is used, there arises the same problem as with the case of the choke coil, so that the interfering radio waves are re-radiated. Further, in this method, since the interfering radio waves are shorted to the ground, when circuits are connected to each other and then connected to a common ground line within the same one electronic appliance, there exists a problem in that the mutual interference occurs between these circuit through the common grounded line. In any cases, in the case of the above-mentioned prior art reflective line radiation preventing elements, the same problems as described above arise in the same circuit or between the two circuits of the same appliance or between the two different appliances, with the result that the circuit operation is not stabilized or ringing phenomenon occurs due to the undesired radio wave reflection along the lines within the circuits of the electronic appliance.

On the other hand, in all the electronic appliances and systems, undesired radio waves must be suppressed as small a level as possible. In case leakage or undesired radio waves are radiated from one electronic appliance, there exists a possibility in that the other appliances, facilities, navigation control systems, etc. may be subjected to the harmful influence of the radio interference. In particular, the erroneous operation of medical instruments and automatic control system causes serious results.

In addition, in the case of the recent electronic appliances, the erroneous operation must be prevented perfectly even when signals of extremely small level are processed, in spite of the fact that the size, weight and power thereof are all minimized. Therefore, the anti-noise characteristics or the resistance capability against interfering radio waves has become important more and more. In addition, there exist many chances that the electronic appliances are exposed to interfering radio waves radiated by other appliances or to strong electric fields of broadcasting waves, movable radio instrument waves, etc., the electronic appliance must be protected from these various radio waves.

Recently, the frequency handled by the electronic appliances has increased more and more with the advance of the operating speed of digital elements. Therefore, when the higher harmonics of the fundamental frequency thereof are considered, the frequency of the radio waves having a possibility of being subjected to the harmful influence of undesired radio waves is very high and the frequency range thereof is wide. Further, the interference degree is largely influenced by the gap formed in the casing or the chassis of the electronic appliance and the conditions of the coaxial cable, power supply lines, control lines, etc. led out of the casing or the chassis thereof. The various conditions of generating interfering radio waves as described above are one of the factors which make difficult the countermeasures for the electronic appliances against the interfering radio waves. However, since the power supply lines, signal input/output lines, etc. led to the inside of the electronic appliance must be protected from the interfering radio waves as perfectly as possible, these countermeasures are important.

SUMMARY OF THE INVENTION

With these problems in mind, therefore, it is the object of the present invention to provide a line radiation preventing element or a line interfering radio wave absorbing element, which can absorb interfering radio waves effectively, without reflecting the interfering radio waves superposed upon a wire or a coaxial cable, in spite of a relatively simple structure and thereby of a low cost.

To achieve the above-mentioned object, the present invention provides a line radiation preventing element for preventing undesired radio waves superposed upon a wire led out of an electronic appliance from being radiated, comprising: a conductive core wire connected to the wire led out of the electronic appliance; a conductive outer pipe arranged concentrically with said conductive core wire, one end of said conductive outer pipe being shorted to said conductive core wire by use of at least one of a shorting plate or an electric capacitance and the other end of said conductive outer pipe being opened; and a magnetic substance arranged between said conductive core wire and an inner wall of said conductive outer pipe.

Further, it is preferable that the two line radiation preventing elements as defined above are arranged so as to be opposed to each other.

Further, it is preferable that the line radiation preventing element further comprises another conductive outer pipe for covering said conductive outer pipe via an insulating substance.

Further, it is preferable that a gap or a dielectric is interposed at least one of between said conductive outer pipe and said magnetic substance and between said magnetic substance and said conductive core wire.

In the line radiation preventing element according to the present invention, the undesired radio waves superposed upon the wire (which may cause the leakage radiation from the wire) are all introduced into the wave guide path and then absorbed thereby. The wave guide path is formed by arranging the conductive core wire in the conductive outer pipe concentrically therewith and by shorting the conductive outer pipe to the conductive core wire at high frequency by use of a shorting plate or a capacitance of concentrated or distributed constant type. One end of the wave guide path is closed as a reflection end, and the other end thereof is opened. Further, the wave guide path is filled with a ferrite magnetic material.

In the present invention, the line radiation preventing element is connected in series to the wire led out of the casing or chassis of an electronic appliance. Therefore, the high frequency current superposed upon the wire can be absorbed when propagating along the wave guide path, so that it is possible to prevent the high frequency from being radiated from the inside to the outside of the casing of the electronic appliance.

Further, when a gap is formed between the magnetic substance arranged in the wave guide path and the outer circumferential surface of the conductive core wire, it is possible to absorb the undesired radio waves in a wider band.

As described above, in the line radiation preventing element according to the present invention, the undesired radio waves superposed upon the wire led out of the casing is introduced into the wave guide path and then absorbed therein. Therefore, it is preferable to construct the wave guide path in such a way that the undesired radio waves can be introduced thereto as effectively as possible.

BRIEF DESCRIPTION OF THE DRAWINGS

FIG. 3(a) is a cross-sectional view showing a first embodiment of the line radiation preventing element according to the present invention;

FIG. 3(b) is a cross-sectional view taken along the line A—A shown FIG. 3(a);

FIG. 4 is an actual reflective attenuation characteristics of the first embodiment shown in FIGS. 3(a) and 3(b);

FIG. 8(a) is a cross-sectional view showing a fourth embodiment of the line radiation preventing element according to the present invention, in which the outer conductive pipes are constructed double and further the preventing elements are connected in cascade;

FIG. 8(b) is a cross-sectional view taken along the line D—D shown in FIG. 8(a);

DETAILED DESCRIPTION OF THE PREFERRED EMBODIMENTS

Prior to the description of the embodiments of the line radiation preventing element according to the present invention, the basic function and the operational concept thereof will be described hereinbelow with reference to FIGS. 1 and 2.

Figure 1:
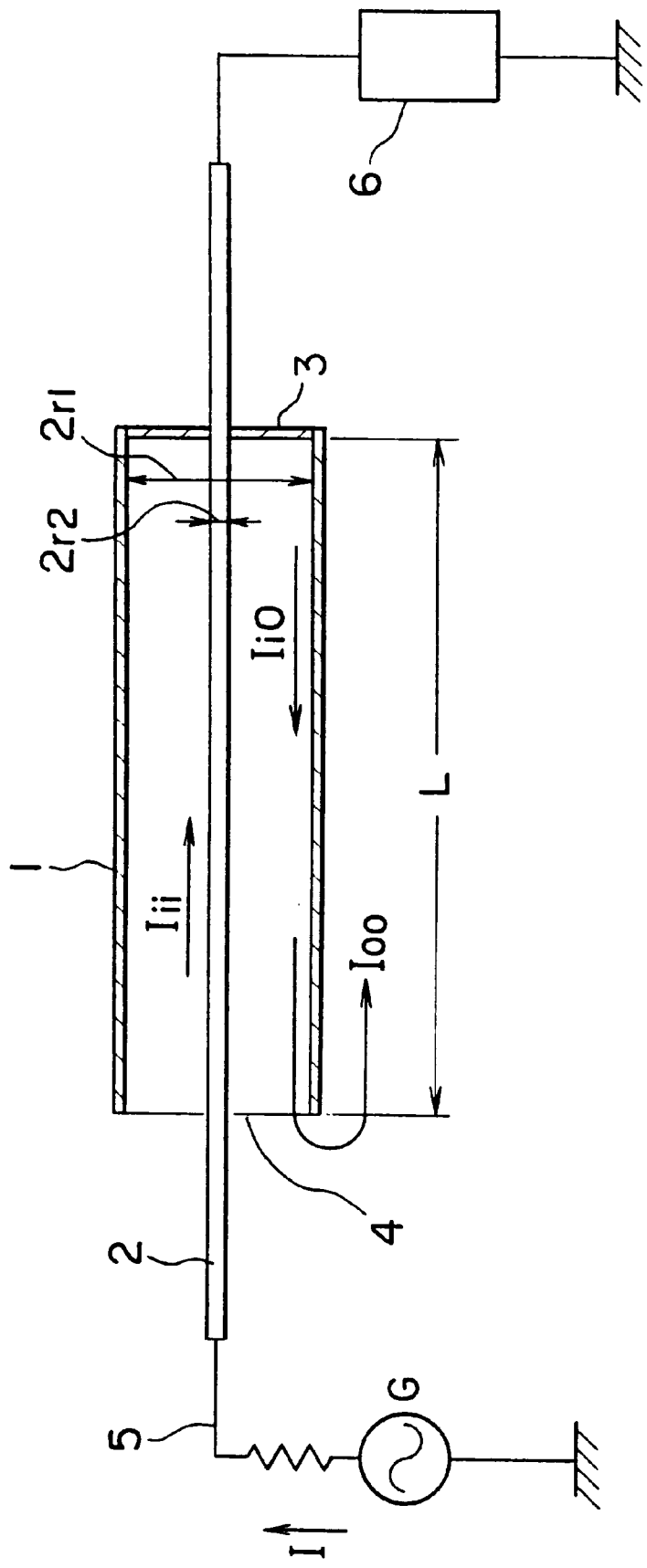
FIG. 1 is a cross-sectional view for assistance in explaining the basic function of the wave guide path of the line radiation preventing element according to the present invention.

In FIG. 1, a conductive core wire 2 formed of copper, for instance is arranged at roughly central position of a conductive outer pipe 1 formed of copper, for instance. The inner diameter of the conductive outer pipe 1 is $2r_1$, and the outer diameter of the conductive core wire 2 is $2r_2$. Further, the conductive outer pipe 1 and the conductive core wire 2 are shorted to each other via a conductive shorting plate (referred to as the conductive shorting disk, hereinafter) 3 attached to a closed end portion of the wave guide path. However, a reactance of distributed constant or a fixed capacitance can be used instead of the conductive shorting disk 3, because the end portion of the wave guide path can be shorted thereby at only high frequency. Further, conductive core wire 2 is arranged at a central position of the conductive outer pipe 1 so as to extend over the axial distance L of the conductive outer pipe 1.

Further, the conductive core wire 2 extends to the outside of the conductive outer pipe 1 beyond the conductive shorting disk 3, and connected to a load 6. Further, an open end 4 is formed on the outside of the conductive outer pipe 1 remote from the closed end (i.e., the conductive shorting disk) 3.

In FIG. 1, power current I flows from a current source G to a line 5. Further, the assumption is made that undesired current $I_{ii}$ is induced on the line 5 and flows through the line 5. Here, only the undesired current $I_{ii}$ is taken into account. The current $Iii$ flows from the left side of the conductive core wire 2 to the conductive shorting disk 3 along the surface of the conductive core wire 2; flows radially outward along the inner surface of the conductive shorting disk 3; flows axially backward along the inner surface of the conductive outer pipe 1 to the open end 4 as current $I_{io}$; propagates along the outer surface of the conductive outer pipe 1 as current $I_{oo}$; and flows radially inward along the outer wall surface of the conductive shorting disk 3 to the conductive core wire 2 and then to the load 6 at which power is to be consumed. Further, the current can flow in a direction opposite to the above direction because the current is ac current.

Here, since the current $I_{ii}$ and the current $I_{io}$ are the same in current rate but opposite in flow direction, it can be considered that the undesired current flowing through the wave guide path is similar to the current flowing through the coaxial cable path. In other words, when the length of the wave guide path is very shorter than the wave length of the undesired current of concern, the current is of coaxial cable propagation mode, that is, quasi-TEM mode.

The feature of the present invention is to remove the current $I_{oo}$ by absorbing the undesired currents $I_{ii}$ and $I_{io}$ of coaxial mode within the wave guide path, so that only the current I flowing from the current source G can be consumed by the load 6.

Figure 2:
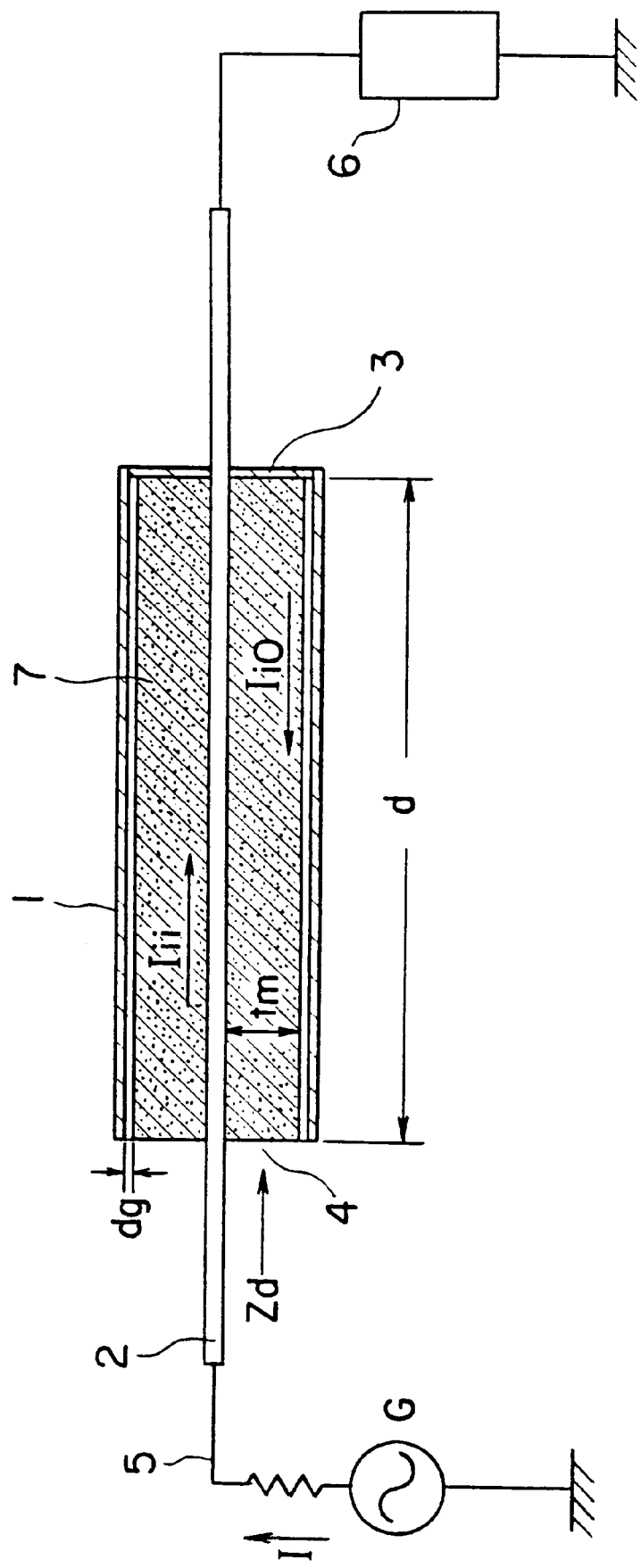
FIG. 2 is a cross-sectional view for assistance in explaining the basic function of the line radiation preventing element according to the present invention.

FIG. 2 shows the wave guide path in which a cylindrical ferrite magnetic substance 7 is inserted into a space formed between the inner wall of the conductive outer pipe 1 and the outer circumference of the conductive core wire 2. The axial length of the cylindrical ferrite magnetic substance 7 is d, and the radial thickness thereof is tm.

In FIG. 2, since the phases of the undesired currents $I_{ii}$ and $I_{io}$ are different from each other by 180 degrees, an input impedance $Z_d$ in the direction from the open end (i.e., gap) 4 to the closed end (i.e., the conductive shorting disk) 3 can be expressed as $$Z_d = Z_c \cdot \tanh \gamma \cdot d$$

where $$\dot{Z}_d = \frac{d^2 \mu_0 \mu_r}{2\pi^2 (r_1^2 - r_1^2) \varepsilon_0 \varepsilon_r} \log \frac{r_1}{r_2} \quad (1)$$

$$\dot{Z}_c = \frac{(\dot{Z}_1 + \dot{Z}_d \cdot \tanh \dot{\gamma} \cdot Wm)}{(\dot{Z}_d + \dot{Z}_1 \cdot \tanh \dot{\gamma} \cdot Wm)} \quad (2)$$

In the above formulae, $r_1$ denotes the inner radius of the conductive outer pipe 1; $r_2$ denotes the inner radius of the conductive core wire 2; $\mu_0$ denotes the permeability of air; $\epsilon_0$ denotes the dielectric constant of air; $\mu_r$ denotes the specific permeability of ferrite; $\epsilon_r$ denotes the specific dielectric constant of ferrite; $\gamma$ denotes the propagation constant of a medium in the wave guide path; and $\omega$ denotes the angular frequency.

Further, in the present invention, it is also possible to construct the wave guide path by providing a space dg between the outer circumference of the ferrite magnetic substance 7 and the inner wall of the conductive outer pile 1, as shown in FIG. 2. In this case, the specific permeability $\mu_r$ and the specific dielectric constant $\epsilon_r$ of the whole wave guide path become smaller than those of the ferrite material itself, because of the presence of the gap dg. Therefore, when there exists the gap dg, the input impedance differs from that obtained when the inner space dg (wave guide path) of the conductive outer pipe 1 is filled with the magnetic substance as expressed by the formula (1). In this case, however, when it is assumed that the wave guide path is filled with an effective medium having the specific permeability and the specific dielectric constant including the gap dg, it is possible to express the input impedance in accordance with the formula (1).

In this case, the specific permeability $\mu$hd er and $\epsilon_{er}$ of the effective medium can be expressed as $$\mu_{er} = (dg + \mu_r \cdot tm)/d$$

$$\epsilon_{er} = d.\epsilon_r/(dg.\epsilon_r + tm) \quad (3)$$

where tm denotes the radial thickness of the magnetic substance; d denotes the axial length of the wave guide path; dg denotes the total gap of the wave guide path and the magnetic substance.

Therefore, when the above values $\mu_{er}$ and $\epsilon_{er}$ of the formula (2) are substituted for $\mu_r$ and $\epsilon_r$ of the formula (1), it is possible to express the input impedance of the wave guide path having a gap.

In general, the specific permeability $\mu_{er}$ and $\epsilon_{er}$ of the magnetic medium can be expressed by a complex number as $$\mu_r = \mu_{r1} - j\mu_{r2}$$

$$\epsilon_r = \epsilon_{r1} - j\epsilon_{r2}$$

where $\mu_{r1}$ denotes the real number portion of the specific permeability $\mu_r$; $\mu_{r2}$ denotes the imaginary number portion thereof; $\epsilon_{r1}$ denotes the real number portion of the specific dielectric constant $\epsilon_r$; and $\epsilon_{r2}$ denotes the imaginary number portion thereof. Therefore, both the values have dispersive characteristics in dependence upon frequency, respectively.

When NiZn sintered ferrite is used and further the specific permeability of the ferrite is measured by magnetizing it by applying a dc voltage, although the specific permeability of the ferrite material differs according to the material, the value of $\mu_{r1}$ of the formula (3) is 10 to 2500 approximately. Further, the value of $\mu_{r2}$ is large when $\mu_{r1}$ is large. Here, both the values change according to frequency.

The frequency characteristics are such that the value of $\mu_{r1}$ changes at roughly a constant rate beginning from dc to a certain frequency, and then decreases monotonously. On the other hand, the value of $\mu_{r2}$ reaches a peak value of about a half of the value of $\mu_{r1}$ at a frequency, and then decreases as a triangular frequency dependency.

Further, when the NiZn sintered ferrite is used, although the specific dielectric constant of the ferrite material itself differs according to the materials, the value of $\epsilon_{r1}$ of the formula (3) is 12 to 15 approximately, without being subjected to the influence of frequency, so that the value of $\epsilon_{r2}$ is generally very small.

In the following description, the specific permeability and the specific dielectric constant indicate the real number portions $\mu_{r1}$ and $\epsilon_{r1}$ as expressed by the formula (3). Further, these values are assumed to be measured by applying a dc voltage thereto, as far as not particularly specified. Further, as the matter of course, the specific permeability $\mu_{er}$ and the specific dielectric constant $\epsilon_{er}$ both calculated on the basis of the above real number portions thereof have the dispersive characteristics in dependence upon frequency, respectively.

Therefore, when the input impedance $Z_d$ as expressed in accordance with the formula (1) is normalized by $Z_c$, if the value is 1, this indicates that the undesired current $I_{ii}$ or $I_{io}$ propagates along the wave guide path without any reflection, with the result that the undesired current can be absorbed (converted into heat loss) by the magnetic loss of the ferrite magnetic substance arranged in the wave guide path.

Further, in the present invention, it is unnecessary to form the magnetic substance inserted into the wave guide path in such a way that the radial thickness tm thereof is kept constant from the open end 4 to the closed end (the conductive shorting disk) 3. Rather, it is preferable to change the radial thickness tm of the magnetic substance stepwise in the axial direction from the open end 4 to the close end 3, in such a way that the radial thickness tm is kept uniform at a predetermined axial length d thereof but increased stepwise at a predetermined axial position from the open end. In this case, it is possible to obtain a line radiation preventing element of wider frequency range.

Some embodiments of the present invention will be described hereinbelow with reference to the attached drawings.

First Embodiment

FIGS. 3(a) and 3(b) show the first embodiment of the line radiation preventing element according to the present invention. In FIG. 3(a), the line radiation preventing element is composed of a conductive outer pipe 1, a conductive core wire 2, a conductive shorting disk 3 for shorting the conductive outer pipe 1 and the conductive core wire 2, a ferrite magnetic substance 7, and an insulating substance 9. Further, in FIG. 3(a), the power supply line is denoted by 5; a load of an electronic appliance is denoted by 6; the left side of the wave guide path (the open end) is denoted by 4; a wall surface of a casing of the electronic appliance is denoted by 8; and the inside of the casing is denoted by 10. The line radiation preventing element is attached to the wall surface 8 of the casing via the insulating substance 9 so as to extend to the outside of the casing.

In this first embodiment, the power source is supplied from the right side in FIG. 3(a) to the casing inside 10. The line radiation preventing element of the first embodiment can prevent the undesired radio waves induced on and along the power source line (the left side wire) 5 on the casing inside 10 from being radiated from the power source line (the right side wire) 5 extending to the outside of the casing. In addition, when the power source current is supplied to the electronic appliance through the right side wire 5 and then to the conductive core wire 2, since the conductive core wire 2 is fixed to the central portion of the conductive shorting disk 3 by soldering, for instance, undesired radio waves flow radially outward along the surface of the conductive shorting disk 3; flows along the outer wall surface of the conductive outer pipe 1; turns to the inner wall surface of the conductive outer pipe 8' at the open end 4 thereof; and then flows into the casing inside 10 through the conductive core wire 2. Therefore, the undesired radio waves generated on the outside of the casing can be also absorbed when flowing through the wave guide path. In summary, undesired radio waves generated on both the inside and outside of the casing of the electronic appliance can be absorbed when flowing between the conductive core wire 2 and the conductive outer pipe 1 (i.e., the wave guide path formed of ferrite magnetic substance 7).

Further, since the exposed portions of the conductive core wire 2 and the conductive outer pipe 1 are charged portion, it is necessary to cover the surfaces of these exposed portions by use of a cover (not shown) of appropriate shape for safety.

In FIG. 3(a), the diameter of the conductive outer pipe 1 for constructing the wave guide path is set to 5.0 mm, and the diameter of the conductive core wire 2 is set to 0.6 mm. The material of the magnetic substance 7 is NiZn sintered ferrite having a specific permeability $\mu_r$ of 2,500 and a specific dielectric constant $\epsilon_r$ of 15. The magnetic substance 7 is formed into a cylindrical shape having a radial thickness tm of 1.35 mm and an outer diameter of 3.3 mm. Further, a central axial hole having a diameter of about 0.6 mm is formed at the center of the magnetic substance 7. The axial length d of the magnetic substance is set to 7.6 mm. Further, the conductive core wire 2 is in tight contact with the central hole of the magnetic substance. However, there exists a gap dg of 0.85 mm between the outer circumference of the magnetic substance 7 and the inner wall of the conductive outer pipe 1.

In the construction as described above, the effective specific permeability $\mu_{er}$ of the wave guide path is about 2,010, and the effective specific dielectric constant $\epsilon_{er}$ of the wave guide path is about 4.

FIG. 4 shows the radio wave absorption characteristics of the first embodiment of the line radiation preventing element shown in FIGS. 3(a) and 3(b). In this case, the interfering radio waves propagating from the load 6 to the conductive shorting disk 3 can be attenuated by the magnetic substance (i.e., cylindrical ferrite) 7, when a high frequency signal is supplied to the conductive core wire 2 and the conductive outer pipe 1 both disposed on the casing inside 10 from the outside, instead of interfering radio waves.

FIG. 4 indicates that the reflective attenuation rate (R/L) of the interfering radio waves is 20 dB or more; in other words, that 99% or more incident energy of the interfering radio waves can be absorbed in as wide a frequency range as between 30 and 2,500 MHz.

Second Embodiment

Figure 5:
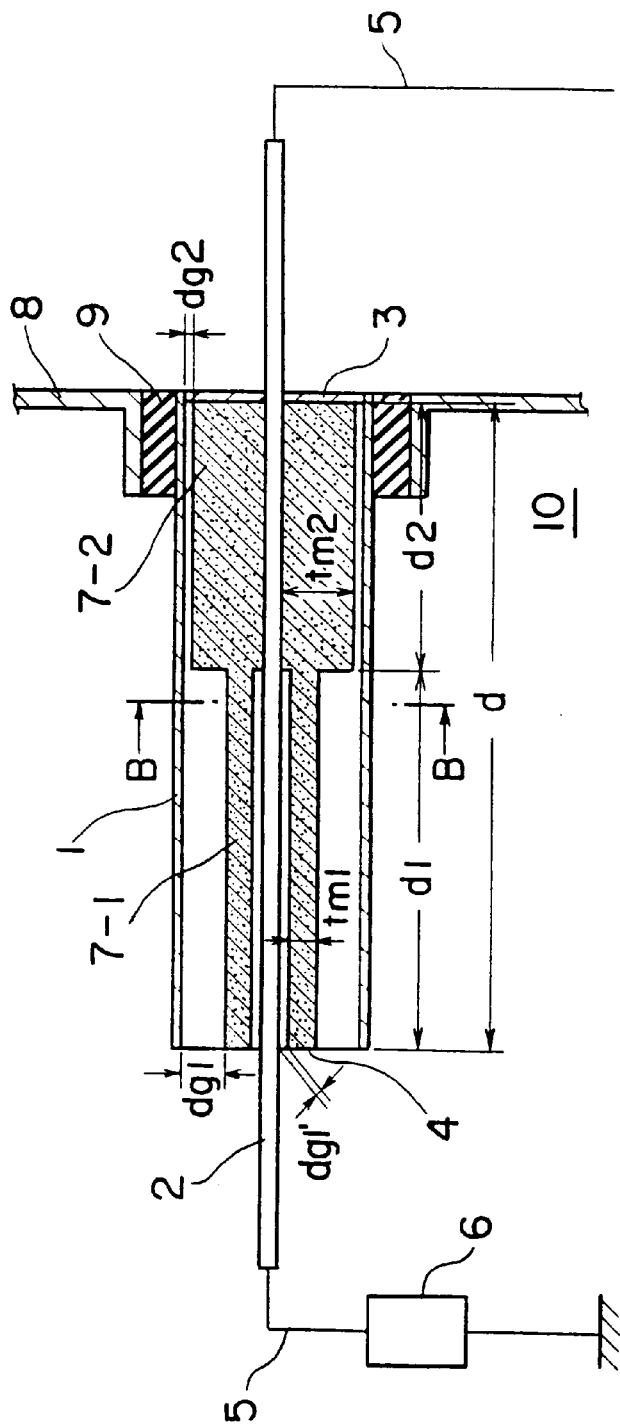
FIG. 5(a) is a cross-sectional view showing a second embodiment of the line radiation preventing element according to the present invention, in which the magnetic substance is constructed at two stages.
FIG. 5(b) is a cross-sectional view taken along the line B—B shown in FIG. 5(a)
Figure 5:
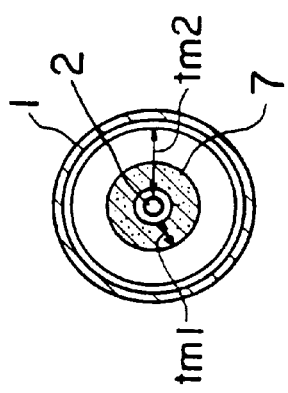

FIGS. 5(a) and 5(b) show the second embodiment of the line radiation preventing element according to the present invention. The feature of this second embodiment is to use two ferrite magnetic substances 7-1 and 7-2 having two different radial thickness tm1 and tm2, respectively.

In FIG. 5(a), the line radiation preventing element is composed of a conductive outer pipe 1, a conductive core wire 2, a conductive shorting disk 3 for shorting the conductive outer pipe 1 and the conductive core wire 2, two ferrite magnetic substances 7-1 and 7-2, and an insulating substance 9. Further, in FIG. 5(a), a power source line is denoted by 5, a load of an electronic appliance is denoted by 6, the left side (the open end) of the wave guide path is denoted by 4; a wall surface of a casing of the electronic appliance is denoted by 8; and the inside of the casing is denoted by 10. The line radiation preventing element is attached to the wall surface 8 of the casing via the insulating substance 9 so as to extend to the inside of the casing.

Further, the radial thickness tm1 of the ferrite magnetic substance 7-1 disposed near the open end 4 is determined thinner that tm2 of the ferrite magnetic substance 7-2 disposed near the closed end (the conductive shorting disk) 3. Further, the axial length d1 of the ferrite magnetic substance 7-1 is different from that d2 of the ferrite magnetic substance 7-2. In this second embodiment, since the two ferrite magnetic substances 7-1 and 7-2 are used, it is possible to widen the frequency band of the attenuation range, as compared with the first embodiment.

In this second embodiment, the power source is supplied from the right side in FIG. 5(a) to the casing inside 10, the line radiation preventing element of the second embodiment can prevent the undesired radio waves induced on and along the power source line (the left side wire) 5 on the casing inside 10 from being radiated from the power source line (the right side wire) 5 extending to the outside of the casing. In addition, when the power source current is supplied to the electronic appliance through the right side wire 5 and then to the conductive core wire 2, since the conductive core wire 2 is fixed to the central portion of the conductive shorting disk 3 by soldering, for instance, undesired radio waves flow radially outward along the surface of the conductive shorting disk 3; flows along the outer wall surface of the conductive outer pipe 1; turns to the inner wall surface of the conductive outer pipe 2 at the open end 4 thereof; and then flows into the casing inside 10 through the conductive core wire 2. Therefore, the undesired radio waves generated on the outside of the casing can be also absorbed when flowing through the wave guide path (the two ferrite magnetic substances 7-1 and 7-2) arranged in the conductive outer pipe 1. In summary, undesired radio waves generated on both the inside and outside of the casing of the electronic appliance can be absorbed when flowing between the conductive core wire 2 and the conductive outer pipe 1 (i.e., the wave guide path formed of ferrite magnetic substance 7).

Therefore, since the exposed portions of the conductive core wire 2 and the conductive outer pipe 1 are charged portion, it is necessary to cover the surfaces of these exposed portions by use of a cover (not shown) of appropriate shape for safety.

In FIG. 5(a), the diameter of the conductive outer pipe 1 for constructing the wave guide path is set to 5.0 mm, and the diameter of the conductive core wire 2 is set to 0.6 mm. The material of the two ferrite magnetic substances 7-1 and 7-2 is NiZn sintered ferrite having a specific permeability $\mu_r$ of 2,500 and a specific dielectric constant $\epsilon_r$ of 15. The magnetic substance 7-1 is formed into a cylindrical shape having a radial thickness tm1 of 0.4 mm and an outer diameter of 2.0 mm. Further, a central axial hole having a diameter of about 1.2 mm is formed at the center of the magnetic substance 7-1. On the other hand, the magnetic substance 7-2 is formed into a cylindrical shape having a radial thickness tm2 of 1.7 mm and an outer diameter of 4.0 mm. Further, a central axial hole having a diameter of about 0.6 mm is formed at the center of the magnetic substance 7-2.

The axial length d1 of the magnetic substance 7-1 is set to 10.0 mm, and the axial length d2 of the magnetic substance 7-2 is set to 4.3 mm. Further, in the case of the ferrite magnetic substance 7-1, there exists a gap dg1 of 1.5 mm between the outer circumference thereof and the inner wall of the conductive outer pipe 1 and a gap dg1' of 0.3 mm between the inner circumference thereof and the outer circumference of the conductive core wire 2. On the other hand, in the case of the ferrite magnetic substance 7-2, there exists a gap dg2 of 0.5 mm between the outer circumference thereof and the inner wall of the conductive outer pipe 1. However, the inner circumference of the ferrite magnetic substance 7-2 is in tight contact with the outer circumference of the conductive core wire 2.

In the construction as described above, the effective specific permeability $\mu_{er}$ of the ferrite magnetic substance 7-1 is about 603, and the effective specific dielectric constant $\epsilon_{er}$ thereof is about 1.29. Further, the effective specific permeability $\mu_{er}$ of the ferrite magnetic substance 7-2 is about 2,240, and the effective specific dielectric constant $\epsilon_{er}$ thereof is about 6.1.

Figure 6:
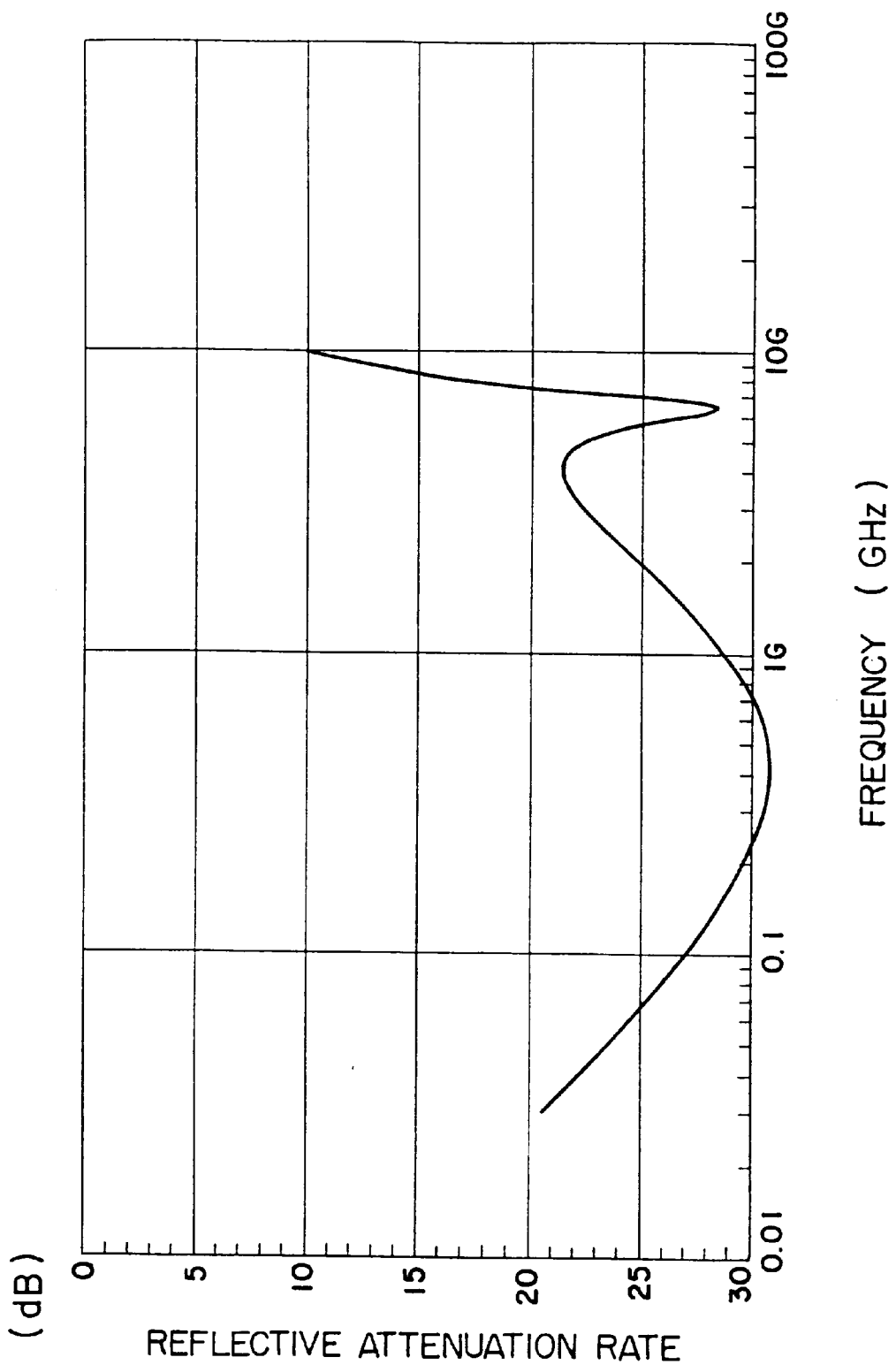
FIG. 6 is an actual reflective attenuation characteristics of the second embodiment shown in FIGS. 5(a) and 5(b)

FIG. 6 shows the radio wave absorption characteristics of the second embodiment of the line radiation preventing element shown in FIGS. 5(a) and 5(b). In this case, the interfering radio waves propagating from the load 6 to the conductive shorting disk 3 can be attenuated by the two ferrite magnetic substances 7-1 and 7-2, when a high frequency signal is supplied to the conductive core wire 2 and the conductive outer pipe 1 both disposed on the casing inside 10 from the outside, instead of interfering radio waves.

FIG. 6 indicates that the reflective attenuation rate (R/L) of the interfering radio waves is 20 dB or more in as wide a frequency range as between 27 and 7,500 MHz (wider than that of the first embodiment).

Third Embodiment

Figure 7A:
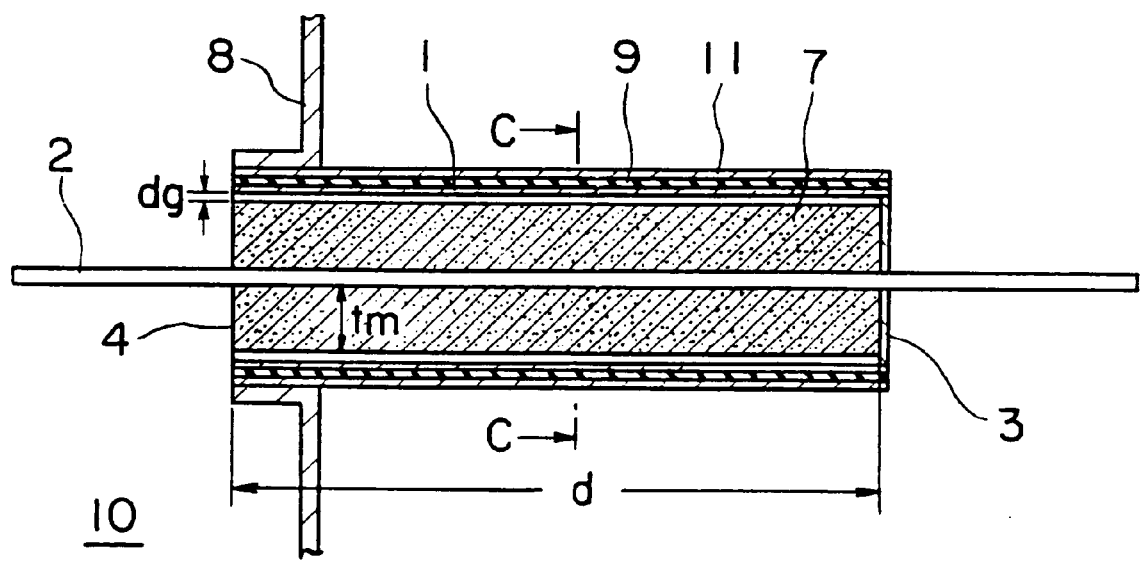
FIG. 7(a) is a cross-sectional view showing a third embodiment of the line radiation preventing element according to the present invention, in which the outer conductive pipes are constructed double.
Figure 7B:
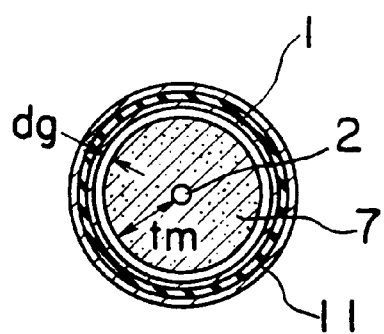
FIG. 7(b) is a cross-sectional view taken along the line C—C shown in FIG. 7(a)

FIGS. 7(a) and 7(b) show the third embodiment of the line radiation preventing element according to the present invention. This third embodiment is different from the first embodiment shown in FIGS. 3(a) and 3(b) in that a second conductive outer pipe 11 connected to the metal casing is additionally attached on the outer circumference of the conductive outer pipe 1 via an insulating substance 9.

In FIG. 7(a), the line radiation preventing element is composed of a conductive outer pipe 1, a conductive core wire 2, a conductive shorting disk 3 for shorting the conductive outer pipe 1 and the conductive core wire 2, a ferrite magnetic substance 7, an insulating substance 9, and a second conductive outer pipe 11. Further, in FIG. 7(a), the left side (the open side) of the wave guide path is denoted by 4; a wall surface of a casing of the electronic appliance is denoted by 8; and the inside of the casing is denoted by 10. However, a power source line and a load of an electronic appliance are both not shown for brevity.

The line radiation preventing element is attached to the wall surface 8 of the casing by directly connecting the second conductive outer pipe 11 to the casing wall surface 8 via the insulating substance 9. In this third embodiment, when the insulating substance 9 is formed of a material of high dielectric constant, since a capacitance can be formed between the conductive outer pipe 1 and the second conductive outer pipe 11, it is possible to short the casing wall surface 8 to the conductive outer pipe 1 at high frequency. As a result, undesired current leaking from the gap of the hole formed between the casing wall surface 8 and the conductive outer pipe 1 can be effectively prevented from being radiated therefrom, being different from the first and second embodiments.

In this third embodiment, when the various dimensions and constants are determined in the same way as with the case of the first embodiment, it is possible to obtain the radio wave absorption characteristics similar to those of the first embodiment, while preventing the leakage current from being radiated from the hole formed in the casing.

Fourth Embodiment

FIGS. 8(a) and 8(b) show the fourth embodiment of the line radiation preventing element according to the present invention. This fourth embodiment is different from the third embodiment shown in FIGS. 7(a) and 7(b) in that two line radiation preventing elements are connected in series to each other by intervening a common conductive shorting disk 3 between the two.

In FIG. 8(a), the line radiation preventing element is composed of a conductive outer pipe 1, a conductive core wire 2, a conductive shorting disk 3 for shorting the conductive outer pipe 1 and the conductive core wire 2 at an axially middle position of the pipes 1 and 11, two ferrite magnetic substances 7, an insulating substance 9, and a second conductive outer pipe 11. Further, in FIG. 8(a), the left side (the open end) of the wave guide path is denoted by 4; a wall surface of a casing of the electronic appliance is denoted by 8; and the inside of the casing is denoted by 10. However, a power source line and a load of an electronic appliance are both not shown for brevity.

The line radiation preventing element is attached to the wall surface 8 of the casing by directly connecting the second conductive outer pipe 11 to the casing wall surface 8 via the insulating substance 9. In this fourth embodiment, when the insulating substance 9 is formed of a material of high dielectric constant, since a capacitance can be formed between the conductive outer pipe 1 and the second conductive outer pipe 11, it is possible to short the casing wall surface 8 to the conductive outer pipe 1 at high frequency. As a result, the undesired current leaking from the gap of the hole formed between the casing wall 8 and the conductive outer pipe 1 can be effectively prevented from being radiated therefrom, in the same way as with the case of the third embodiment.

In this fourth embodiment, the power source is supplied from the right side in FIG. 8(a) to the casing inside 10. The line radiation preventing element of this fourth embodiment can prevent the undesired radio waves induced on and along the power source wire (the left side wire) on the casing inside 10 from being radiated from the power source line (the right side wire) extending to the outside of the casing. In addition, when the power source current is supplied to the electronic appliance through the conductive wire 2, it is possible to absorb external noise induced on the power supply line on the casing outside. The function and the attenuation characteristics of the line radiation preventing element of this fourth embodiment are almost equivalent to those of the third embodiment.

Fifth Embodiment

Figure 9A:
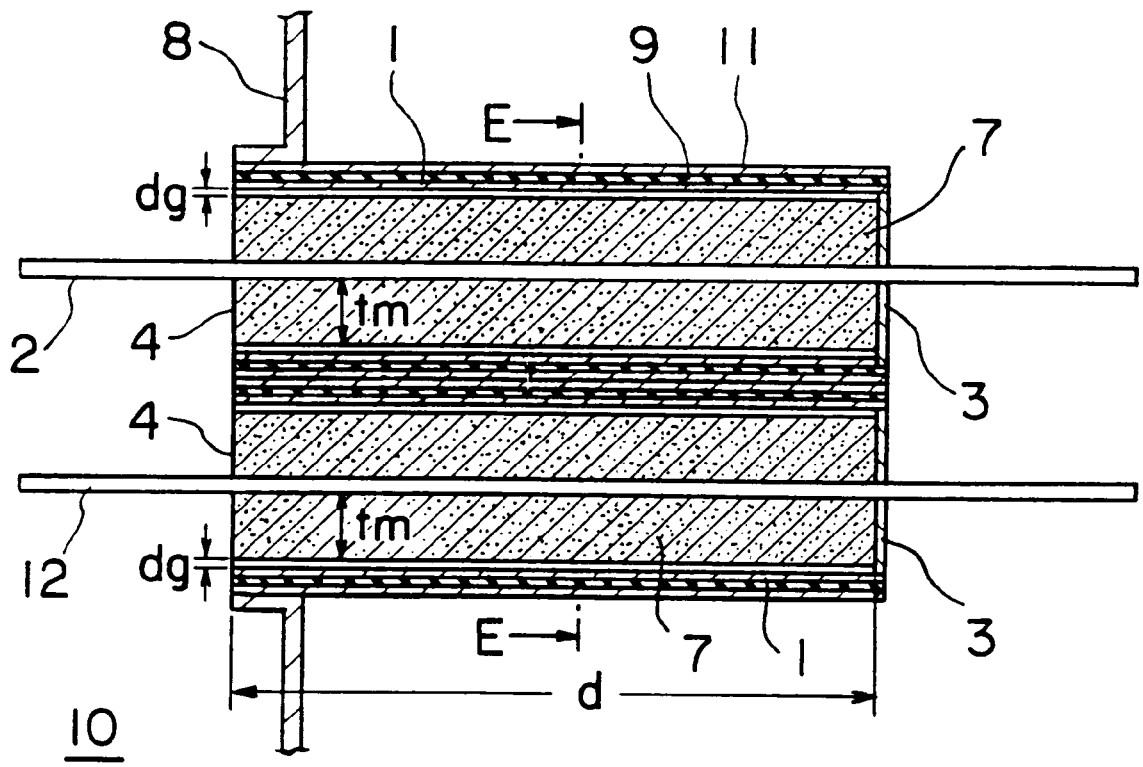
FIG. 9(a) is a cross-sectional view showing a fifth embodiment of the line radiation preventing element according to the present invention, in which the outer conductive pipes are constructed double and further the preventing elements are connected in parallel.
Figure 9B:
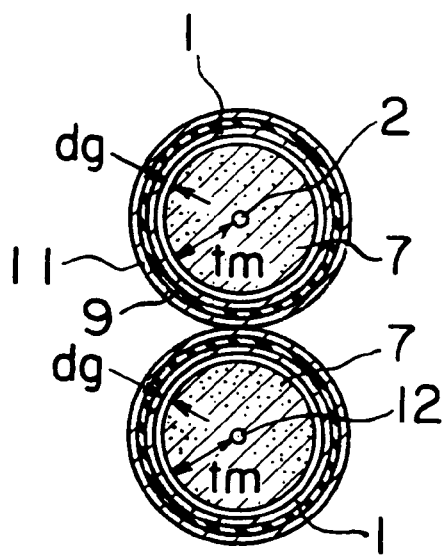
FIG. 9(b) is a cross-sectional view taken along the line E—E shown in FIG. 9(a)

FIGS. 9(a) and 9(b) show the fifth embodiment of the line radiation preventing element according to the present invention. This fifth embodiment is different from the third embodiment shown in FIGS. 7(a) and 7(b) in that two line radiation preventing elements of the third embodiment are arranged in parallel to each other.

In FIG. 9(a), the line radiation preventing element is composed of two conductive outer pipes 1, two conductive core wires 2, two conductive shorting disks 3 for shorting the two conductive outer pipes 1 and the two conductive core wires 2 respectively, two ferrite magnetic substance 7, two insulating substances 9, and two second conductive outer pipes 11. Further, in FIG. 9(a), the left side (the open side) of the two wave guide paths is denoted by 4; a wall surface of a casing of the electronic appliance is denoted by 8; and the inside of the casing is denoted by 10.

The line radiation preventing element is attached to the wall surface 8 of the casing by directly connecting the two second conductive outer pipes 11 to the casing wall surface 8 via the two insulating substances 9. In this fourth embodiment, when the insulating substances 9 are formed of a material of high dielectric constant respectively, since two capacitances can be formed between the conductive outer pipes 1 and the second conductive outer pipes 11, respectively, it is possible to short the casing wall surface 8 to the two conductive outer pipes 1 at high frequency. As a result, the undesired current leaking from the gap of the hole formed between the casing wall 8 and the two conductive outer pipes 1, respectively can be effectively prevented from being radiated therefrom, being different from the first and second embodiments.

In this fifth embodiment, since the two line radiation preventing elements are arranged independently from each other, there exists no mutual interference (e.g., crosstalk) between the two core wires 2. Further, when signals are led out of the casing inside 10 through the two conductive core wires 2 separately, it is possible to absorb the undesired radio waves induced on and along the wires 2 on the casing inside 10, while preventing the leakage current from being radiated from the hole formed in the casing. The fifth embodiment is particularly suitable for the case where two power supply lines are required.

Sixth Embodiment

Figure 10:
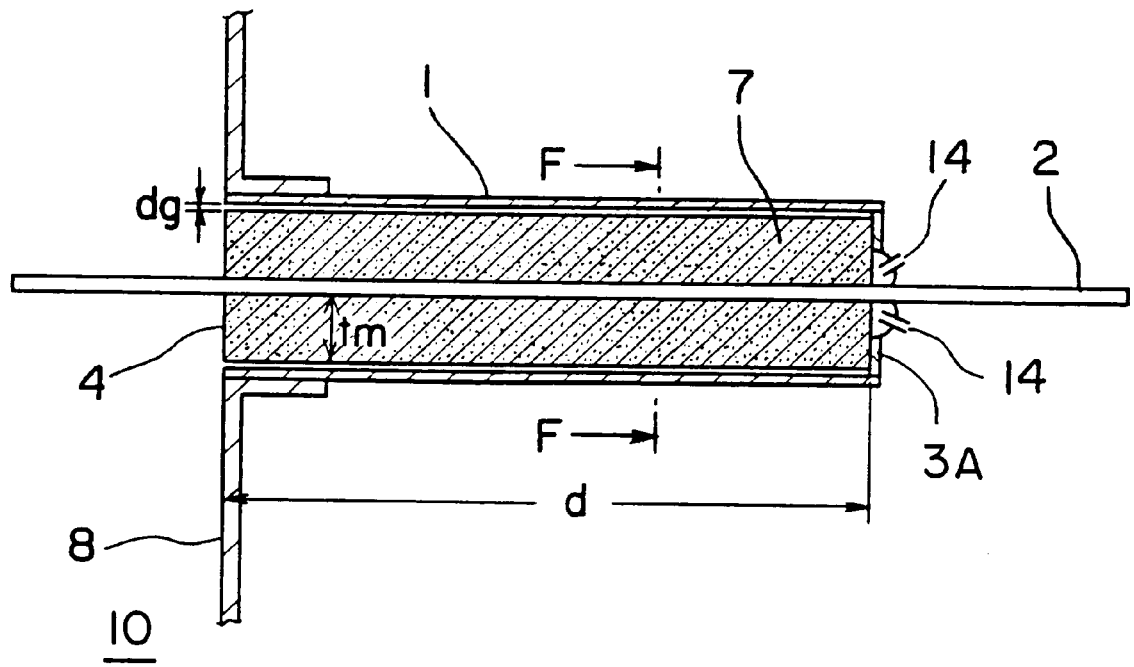
FIG. 10(a) is a cross-sectional view showing a sixth embodiment of the line radiation preventing element according to the present invention, in which a fixed capacitance is used to short the wave guide path.
FIG. 10(b) is a cross-sectional view taken along the line F—F show FIG. 10(a)
Figure 10:
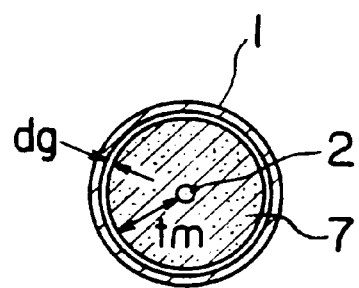

FIGS. 10(a) and 10(b) show the sixth embodiment of the line radiation preventing element according to the present invention. This sixth embodiment is different from the first embodiment shown in FIGS. 3(a) and 3(b) in that the conductive core wire 2 is shorted to the conductive outer pipe 1 at high frequency by use of a conductive disk 3A and a fixed capacitance 14.

In FIG. 10(a), the line radiation preventing element is composed of a conductive outer pipe 1, a conductive core wire 2, a conductive disk 3A formed with a central hole large enough not to be brought into contact with the conductive core wire 2, a fixed capacitance 14, and a ferrite magnetic substance 7. Therefore, the conductive outer pipe 1 can be shorted to the conductive core wire 2 via the fixed capacitance 14 at only high frequency. Further, in FIG. 10(a), the left side (the open side) of the two wave guide paths is denoted by 4; a wall surface of a casing of the electronic appliance is denoted by 8; and the inside of the casing is denoted by 10.

Further, in the case of the third embodiment shown in FIGS. 7(a) and 7(b), although the insulating substance 9 is interposed between the conductive wire 2 and the second conductive outer pipe 11 to short the conductive outer pipe 1 to the casing wall surface 8 at high frequency, in this sixth embodiment, the conductive outer pipe 1 can be directly connected to the casing surface 8, without use of the insulating substance. This is because although the high frequency interfering radio waves flows along the inner surface of the conductive outer pipe 1, the power current will not flow through the conductive outer pipe 1.

Therefore, in this sixth embodiment, it is possible to prevent undesired radio waves from being radiated from the gap formed between the hole formed in the casing surface 8 and the conductive outer pipe 1.

Seventh Embodiment

Figure 11A:
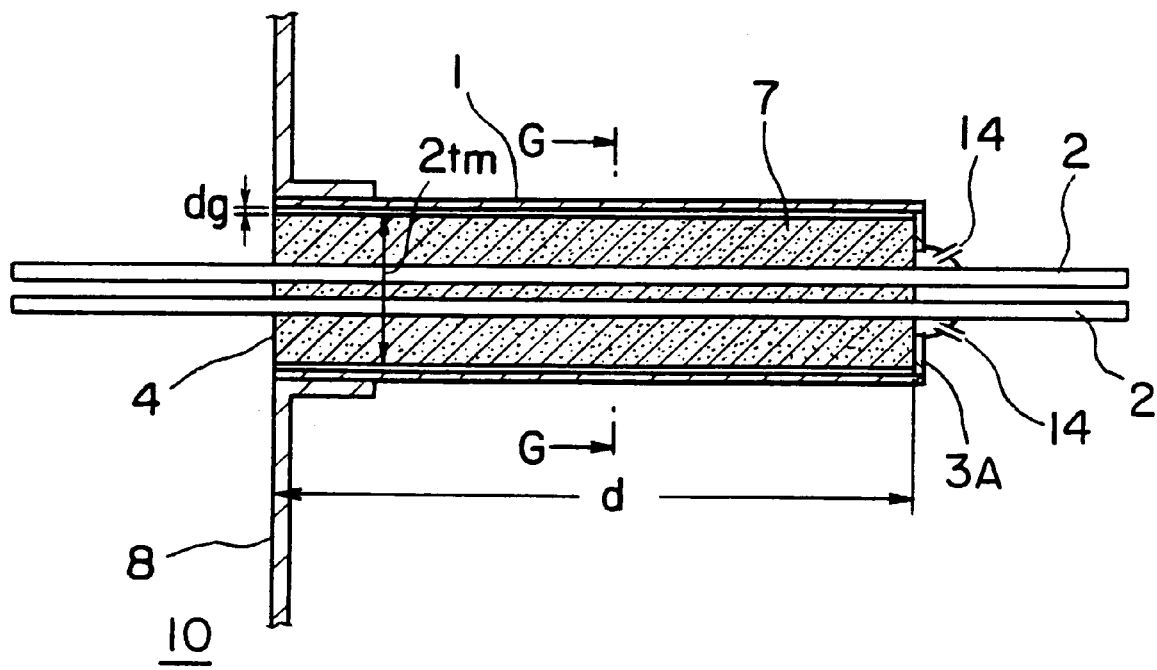
FIG. 11(a) is a cross-sectional view showing a seventh embodiment of the line radiation preventing element according to the present invention, in which two core wires are arranged and two fixed capacitance are used to short the wave guide path.
Figure 11B:
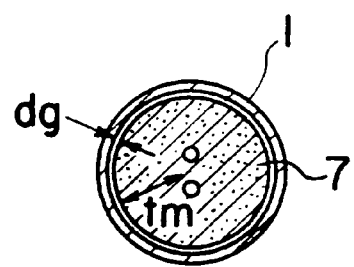
FIG. 11(b) is a cross-sectional view taken along the line G—G show in FIG. 11(a)

FIGS. 11(a) and 11(b) show the seventh embodiment of the line radiation preventing element according to the present invention. This seventh embodiment is different from the sixth embodiment shown in FIGS. 10(a) and 10(b) in that two conductive core wires 2 are arranged in the ferrite magnetic substance 7.

In FIG. 11(a), the line radiation preventing element is composed of a conductive outer pipe 1, two conductive core wires 2, a conductive disk 3A formed with a central hole large enough not to be brought into contact with the conductive core wires 2 respectively, two fixed capacitances 14, and a ferrite magnetic substance 7. Therefore, the conductive outer pipe 1 is shorted to the two conductive core wires 2 via the two fixed capacitances 14, respectively.

Further, in this seventh embodiment, although the high frequency interfering radio waves flow along the inner surface of the conductive outer pipe 1, since the power current will not flow to the conductive outer pipe 1, the conductive outer pipe 1 can be connected directly to the casing wall surface. Therefore, it is possible to prevent undesired leakage current from being radiated from the gap formed between the conductive outer pipe 1 and the casing wall surface 8, while eliminating the insulating substance.

Further, in this seventh embodiment, the two conductive core wires 2 are arranged in the common ferrite magnetic substance 7. Therefore, this seventh embodiment is particularly suitable for the case where two currents of two mutually opposite phases flow through the two conductive core wires 2, because the ferrite magnetic substance 7 is not saturated magnetically even if relatively large currents flow through the two conductive core wires, respectively.

Further, it is possible to absorb the undesired radio waves induced on and along the two conductive core wires 2 on the casing inside 10, while preventing the leakage current from being radiated from the hole formed in the casing. Further, in this seventh embodiment, since the two conductive core wires 2 are arranged independently from each other, this seventh embodiment is particularly suitable for when two power supply lines are required.

Eighth Embodiment

Figure 12:
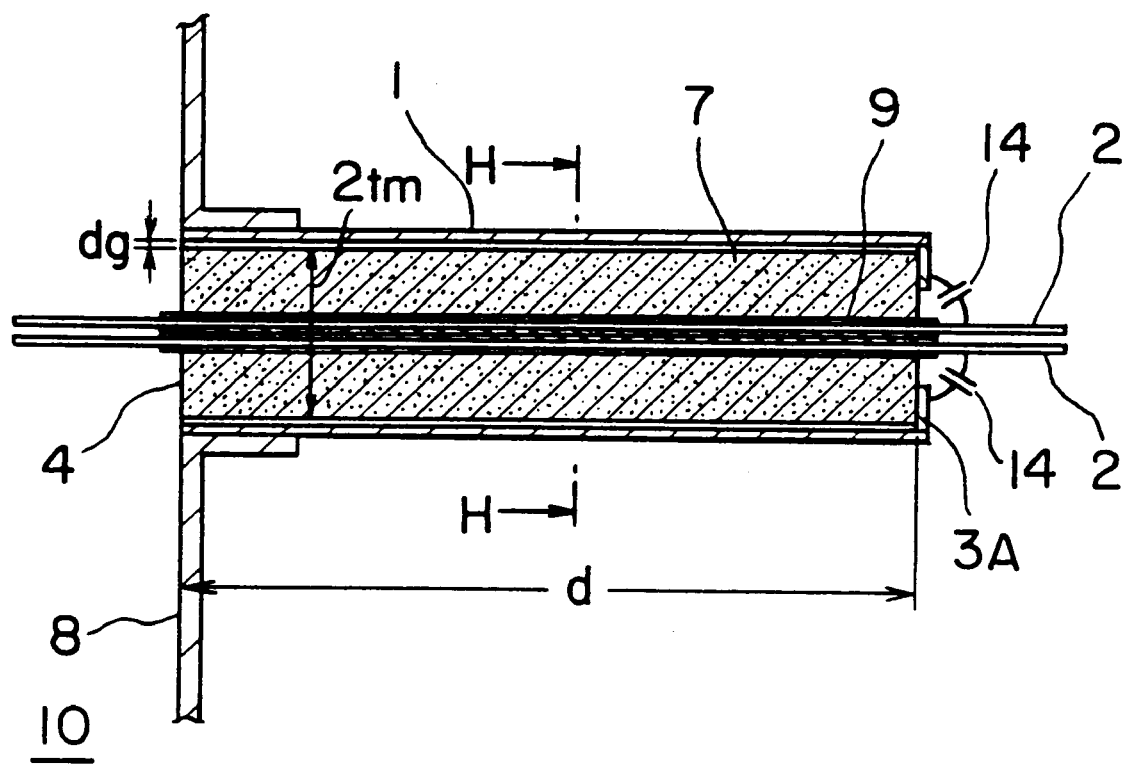
FIG. 12(a) is a cross-sectional view showing an eighth embodiment of the line radiation preventing element according to the present invention, in which two core wires are passed through a single through hole formed in the magnetic substance and two fixed capacitance are used to short the wave guide path.
FIG. 12(b) is a cross-sectional view taken along the line H—H shown in FIG. 12(a)
Figure 12:
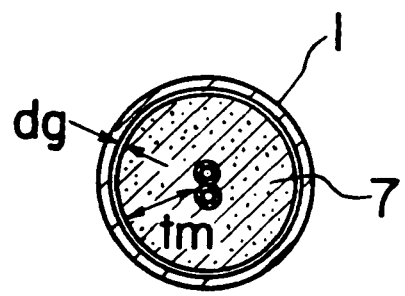

FIGS. 12(a) and 12(b) show the eighth embodiment of the line radiation preventing element according to the present invention. This eighth embodiment is different from the seventh embodiment shown in FIGS. 10(a) and 10(b) in that two conductive core wires 2 are insulated, respectively so that two core wires 2 can be arranged in a single hole formed at roughly a central position of the ferrite magnetic substance 7 in contact with each other. In this eighth embodiment, since the radial thickness of the ferrite magnetic substance can be formed symmetrically with respect to the two conductive core wires 2, there exists such a feature that the cross-sectional area of the ferrite magnetic substance 7 can be reduced.

In FIG. 12(a), the line radiation preventing element is composed of a conductive outer pipe 1, two conductive core wires 2, a conductive disk 3A formed with a central hole large enough not to be brought into contact with the two conductive core wires 2 respectively, two fixed capacitances 14, and a ferrite magnetic substance 7. Therefore, the conductive outer pipe 1 can be shorted to the conductive core wires 2 via the two fixed capacitances 14, respectively.

Further, in FIG. 12(b), the ferrite magnetic substance 7 is formed with a central hole through which the two conductive core wires 2 covered with two insulating substances 19, respectively are passed.

Further, in this eighth embodiment, although the high frequency interfering radio waves flow along the inner surface of the conductive outer pipe 1, since the power current will not flow to the conductive outer pipe 1, the conductive outer pipe 1 can be connected directly to the casing wall surface. Therefore, it is possible to prevent undesired leakage current from being radiated from the gap formed between the conductive outer pipe 1 and the casing wall surface 8, while eliminating the insulating substance.

Further, in this eighth embodiment, the two conductive core wires 2 are arranged in the common ferrite magnetic substance 7. This embodiment is particularly suitable for the case where two currents of two mutually opposite phases flow through the two conductive core wires 2, because the ferrite magnetic substance 7 is not saturated magnetically even if relatively large currents flow through the two conductive core wires, respectively.

Further, it is possible to absorb the undesired radio waves induced on and along the wires 2 on the casing inside 10, while preventing the leakage current from being radiated from the hole formed in the casing. Further, in this eight embodiment, since the two conductive core wires 2 are arranged independently from each other, this eighth embodiment is particularly suitable for when two power supply lines are required.

Ninth Embodiment

Figure 13:
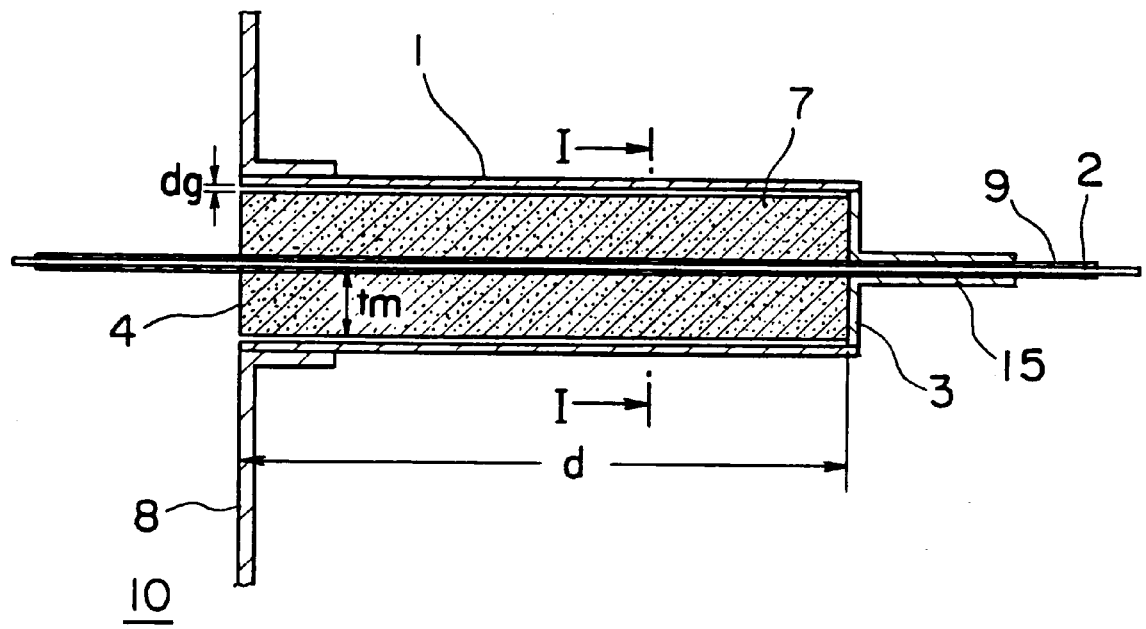
FIG. 13(a) is a cross-sectional view showing a ninth embodiment of the line radiation preventing element according to the present invention, in which a distributed capacitance is used to short the wave guide path.
FIG. 13(b) is a cross-sectional view taken along the line I—I shown in FIG. 13(a)
Figure 13:
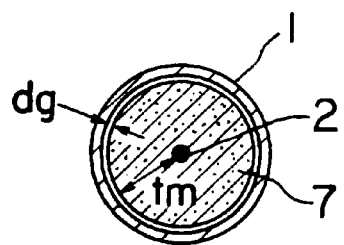
Figure 14:
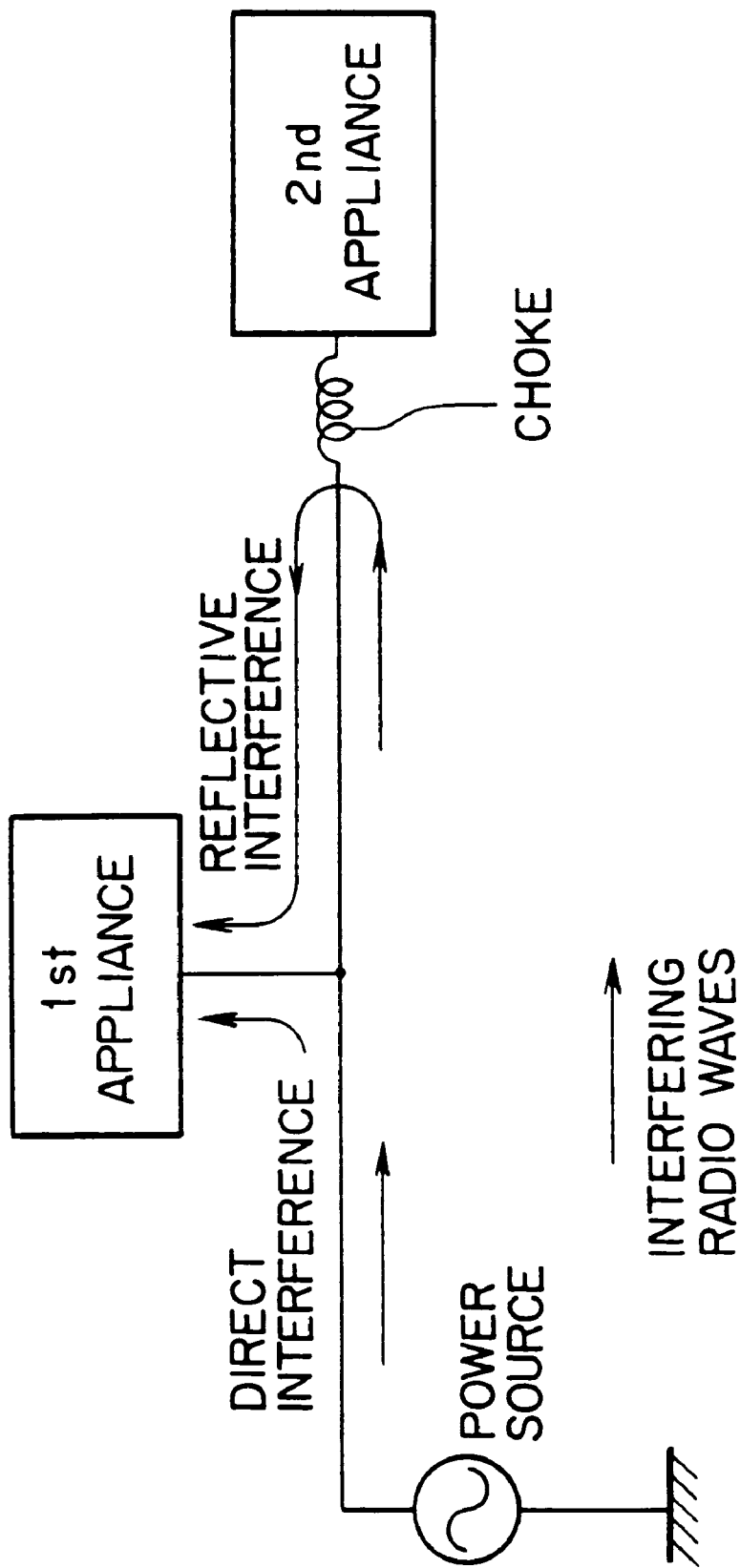
FIG. 14 is a diagram showing an example of the prior art reflective interfering wave removing method.

FIGS. 13(a) and 13(b) show the ninth embodiment of the line radiation preventing element according to the present invention. This ninth embodiment is different from the sixth embodiment shown in FIGS. 10(a) and 10(b) in that the conductive core wire 2 is shorted to the conductive outer pipe 1 at high frequency by use of a capacitance of constant distribution type.

In FIG. 13(a), the line radiation preventing element is composed of a conductive outer pipe 1, a conductive core wire 2, a conductive shorting disk 3 for shorting the conductive outer pipe 1 to the conductive core wire 2 via a distributed capacitance, and a ferrite magnetic substance 7. Further, the conductive shorting disk 3 is formed with a central hole large enough to pass the conductive wire core 2 covered with a metallic pipe 15 by intervening an insulating substance 9 between the conductive core wire 2 and the conductive outer pipe 1. In this ninth embodiment, in order to obtain the attenuation characteristics equivalent to those of the first embodiment, the distribution capacitance must be at least 10 pF. However, since this capacitance is used to short the high frequency, the larger the capacitance is, the better will be the effect thereof.

In this ninth embodiment, since the conductive outer pipe 1 can be connected to the casing directly, it is possible to prevent undesired current from being radiated from the hole formed between the casing wall surface 8 and the conductive outer pipe 1, and further no insulating substance is necessary between the casing wall surface 8 and the conductive outer pipe 1.

In the above-mentioned first to ninth embodiments according to the present invention, although the sintered ferrite has been used as the magnetic substance, it is also possible to use the magnetic substance formed by mixing ferrite powder with plastic, according to the frequency band in which the leakage radiation must be prevented. In general, however, when the effective permeability is high, since the leakage radiation preventing effect can be increased beginning from the lower frequency and further the width of the magnetic substance can be reduced, it is preferable to use a magnetic substance having a high permeability.

However, in the second embodiment shown in FIGS. 5(a) and 5(b) according to the present invention, the effective permeability of the first stage is set to about 600, that is, to a lower value to that of the second stage. In the case of the magnetic substances of multi-stage structure, when the effective permeability of the first stage is determined lower than that of the second stage; that is, when the effective permeability of the multi-stage magnetic substance is increased gradually in the order of the first stage, the second stage, the third stage, . . . , although the operable frequency increases, it is possible to construct the line radiation preventing element of wider band, as compared with the case where the thickness of the magnetic substance is determined constant over the wave guide path.

Further, in the seventh and eighth embodiments according to the present invention, although the number of the conductive core wires is set to two, even if the three or more conductive core wires are passed through the ferrite magnetic substance, the operation is the same as with the case of the seventh and eighth embodiments.

Further, in the line radiation preventing element according to the present invention, the conductive outer pipe, the ferrite magnetic substance, etc. are all formed into circular or cylindrical shape. Without being limited only to the circular or cylindrical shape, however, any other shapes can be adopted. In this case, however, it is necessary to effectively introduce the undesired current superposed upon the wire or line into the wave guide path and to absorb the introduced undesired current by the magnetic substance arranged in the wave guide path. Therefore, it is preferable that the magnetic flux is continuous around the conductive core wire. Therefore, even when the shapes of the parts thereof are modified, it is possible to prevent the undesired current from being radiated from holes or gaps of various shapes in diversified methods.

Further, in the line radiation preventing element according to the present invention, it is preferable to construct the magnetic substances by use of ferrite of the same magnetic material, even in the case of the multi-stage structure from the economical standpoint. This is because when ferrite is molded by sintering ferrite powder temporarily, it is possible to mold the magnetic substances at the respective stages integral with each other at the same time, so that it is possible to reduce the cost thereof markedly, as compared with when the magnetic substances of the multi-stages are manufactured separately at each stage by use of materials of different sorts. As described above, in the line radiation preventing element according to the present invention, since the ferrite magnetic substance having a constant radial thickness over a predetermined axial length thereof or a plurality of cascade-arranged ferrite magnetic substances having stepwise-different radial thicknesses are arranged between the conductive outer pipe and the conductive core wire, when the undesired radio waves are superposed upon the wire or the cable connected to the conductive core wire, it is possible to effectively absorb the undesired radio waves by the ferrite magnetic substance, thus preventing the undesired radio waves from being radiated by the electronic appliance.

What is claimed is:

1. A line radiation preventing element for preventing undesired radio waves superposed upon a wire led out of an electronic appliance from being radiated, comprising:

a conductive core wire connected to the wire led out of the electronic appliance;

a conductive outer pipe arranged concentrically with said conductive core wire, one end of said conductive outer pipe being shorted to said conductive core wire by use of a shorting plate and the other end of said conductive outer pipe being opened; and a radio wave absorbing element arranged between said conductive core wire and an inner wall of said conductive outer pipe.

2. The line radiation preventing element of claim 1, wherein the core wire and outer pipe are arranged so as to be opposed to each other.

3. The line radiation preventing element of claim 2, wherein a gap or a dielectric is interposed between at least one of said conductive outer pipe and said radio wave absorbing element and between said radio wave absorbing element and said conductive core wire.

4. The line radiation preventing element of claim 1, which further comprises another conductive outer pipe for covering said conductive outer pipe via an insulating substance.

5. The line radiation preventing element of claim 1, wherein a gap or a dielectric is interposed between at least one of said conductive outer pipe and said radio wave absorbing element and between said radio wave absorbing element and said conductive core wire.

6. The line radiation preventing element of claim 1, wherein the radio wave absorbing element comprises a magnetic substance.

7. A line radiation preventing element for preventing undesired radio waves superposed upon a wire led out of an electronic appliance from being radiated, comprising:

a conductive core wire connected to the wire led out of the electronic appliance;

a conductive outer pipe arranged concentrically with said conductive core wire, one end of said conductive outer pipe being shorted to said conductive core wire by use of an electric capacitance and the other end of said conductive outer pipe being opened; and a radio wave absorbing element arranged between said conductive core wire and an inner wall of said conductive outer pipe.

8. The line radiation preventing element of claim 7, wherein the core wire and outer pipe are arranged so as to be opposed to each other.

9. The line radiation preventing element of claim 8, wherein a gap or a dielectric is interposed between at least one of said conductive outer pipe and said radio wave absorbing element and between said radio wave absorbing element and said conductive core wire.

10. The line radiation preventing element of claim 7, which further comprises another conductive outer pipe for covering said conductive outer pipe via an insulating substance.

11. The line radiation preventing element of claim 7, wherein a gap or a dielectric is interposed between at least one of said conductive outer pipe and said radio wave absorbing element and between said radio wave absorbing element and said conductive core wire.

12. The line radiation preventing element of claim 7, wherein the radio wave absorbing element comprises a magnetic substance.

* * * * *